(12) United States Patent
Kalley

(10) Patent No.: US 7,129,706 B2
(45) Date of Patent: Oct. 31, 2006

(54) PART TESTER AND METHOD

(75) Inventor: Terrence D. Kalley, Troy, MI (US)

(73) Assignee: Bright Solutions, Inc., Troy, MI (US)

( * ) Notice: Subject to any disclaimer, the term of this patent is extended or adjusted under 35 U.S.C. 154(b) by 69 days.

(21) Appl. No.: 10/458,786

(22) Filed: Jun. 11, 2003

(65) Prior Publication Data

US 2004/0251907 A1    Dec. 16, 2004

(51) Int. Cl.
*G01N 27/416* (2006.01)
(52) U.S. Cl. .......................... 324/426; 320/106
(58) Field of Classification Search ............ 324/426, 324/427, 429, 430, 433; 320/106, 159; 702/63
See application file for complete search history.

(56) References Cited

U.S. PATENT DOCUMENTS

| | | | | | |
|---|---|---|---|---|---|
| 3,753,094 | A | * | 8/1973 | Furuishi et al. ............. | 324/430 |
| 3,909,708 | A | * | 9/1975 | Champlin .................... | 324/431 |
| 4,816,768 | A | * | 3/1989 | Champlin .................... | 324/428 |
| 4,929,931 | A | * | 5/1990 | McCuen ................ | 340/636.15 |
| 5,047,961 | A | * | 9/1991 | Simonsen ..................... | 702/63 |
| 5,298,346 | A | * | 3/1994 | Gyenes ......................... | 429/90 |
| 5,530,361 | A | * | 6/1996 | Andrieu et al. ............. | 324/426 |
| 5,608,306 | A | * | 3/1997 | Rybeck et al. .............. | 320/106 |
| 5,757,595 | A | * | 5/1998 | Ozawa et al. ............ | 340/636.1 |
| 6,008,652 | A | * | 12/1999 | Theofanopoulos et al. . | 324/434 |
| 6,329,822 | B1 | * | 12/2001 | Powers ........................ | 324/426 |
| 6,332,113 | B1 | * | 12/2001 | Bertness ....................... | 702/63 |
| 6,424,157 | B1 | * | 7/2002 | Gollomp et al. ............ | 324/430 |
| 6,605,922 | B1 | * | 8/2003 | Tamai et al. ................. | 320/106 |
| 6,667,624 | B1 | * | 12/2003 | Raichle et al. .............. | 324/522 |
| 6,809,649 | B1 | * | 10/2004 | Wendelrup et al. ...... | 340/636.1 |
| 2003/0019939 | A1 | * | 1/2003 | Sellen .................... | 235/462.45 |
| 2004/0046026 | A1 | * | 3/2004 | Krampitz et al. ....... | 235/462.01 |
| 2005/0001629 | A1 | * | 1/2005 | Chen ........................... | 324/433 |
| 2005/0075807 | A1 | * | 4/2005 | Bertness ....................... | 702/63 |
| 2006/0000902 | A1 | * | 1/2006 | Strawn et al. .............. | 235/382 |

* cited by examiner

*Primary Examiner*—Anjan Deb
(74) *Attorney, Agent, or Firm*—Steptoe & Johnson LLP

(57) ABSTRACT

A part tester can be configured to prevent part warranty fraud by requiring the input of unique part identifying information into a part tester prior to initiation of the testing. By configuring the tester and the information input correctly, warranty fraud can be minimized.

65 Claims, 3 Drawing Sheets

PART TESTER AND METHOD

TECHNICAL FIELD

This invention relates to part testing, and more particularly to fraud free battery testing.

BACKGROUND

Automobile battery evaluation and testing has become an increasingly important service check associated with motor vehicle maintenance. As the technology for testing batteries has evolved, problems have arisen associated with the accuracy test results based on the type of the battery tester. Three examples of battery testers currently available test batteries in fundamentally different ways. The first method includes a conductance test of the battery. The second method measures the battery voltage recovery rate after being exposed to a small continuous load. The third method includes an internal resistance test. Some battery testers can have difficulty determining whether a particular battery should be discarded or not and can return error messages such as "charge battery" and "replace" which are not appropriate for the battery being tested. A frequent message of "charge" or "retest" can extend the time required to determine whether a battery is functioning properly due to the need to first recharge the battery before being able to test it. This extended time requirement when coupled with a possible inaccurate error message, and the lack of fraud prevention methods associated with battery testing can result in an increase in battery warranty costs. Since current battery testers do not gather unique battery identifier data, there is no way to show that the battery that appears on the printed test sheet is the battery that was actually submitted for testing. As a result battery manufacturers and marketers have been defrauded out of money based on manipulated test results.

SUMMARY

A method of testing an automobile battery can include acquiring battery identifying information with a battery testing device and testing a characteristic of the battery with the battery testing device. The testing can include exposing the battery to a very high frequency load pulse and measuring an internal resistance of the battery. The battery testing device obtains a characteristic of the battery.

Alternatively, testing can include applying a first load to the battery for a first time period, measuring the first voltage at the end of the first time period, removing the load, and measuring a first recovery voltage at the end of a first recovery time period. Next, this testing includes applying a second load to the battery for a second time period, measuring a second voltage at the end of the second time period, removing the load and measuring a second recovery voltage at the end of a second recovery time period. The first voltage and the second voltage are compared to determine the characteristic of the battery. The characteristic of the battery can be the ability of the battery to accept and hold a charge.

In another embodiment, testing can include creating a balance circuit between the battery and an adjustment circuit, adjusting the adjustment circuit with an adjustment factor until the battery and the adjustment circuit are in equilibrium, and calculating the conductance of the battery using the adjustment factor.

Acquiring battery identifying information can include reading a bar code. The method can include identifying the battery with the battery identifying information. The bar code can be affixed to the battery. Alternatively, acquiring battery identifying information can include receiving a signal from the battery, or inputting at least a portion of the battery identifying information from the battery with a manual input device. In other embodiments, acquiring battery identifying information can include scanning the information from the battery, receiving light from an emission source associated with the battery, or reading a portion of the information from a chip associated with the battery.

The battery identifying information can be coded. The code can be an alphanumeric code, a pictographic code, or an electromagnetic signal. The electromagnetic signal can include a radio, electrical, magnetic, infrared or visible light signal. The battery identifying information can include a cold crank amperage of the battery, Japanese standard information for the battery, Society of Automotive Engineers (SAE) standard information for the battery, Deutsches Institut für Normung (DIN) specification information for the battery, International Electrotechnical Commission (IEC) standard information for the battery, Européenne Norme (EN) standard information for the battery, manufacturer's name or identifying code, date of manufacture of the battery and any other information useful for warranty cost reduction, quality assurance tracking information or battery identification. The method can include providing a dealer part code or a warranty line number in a report, which can be entered by a service technician or acquired from a database once the battery has been identified.

In another aspect, an apparatus for testing a battery includes a battery tester, and an input device associated with the battery tester. The input device can be configured to receive battery identifying information, transmit battery identifying information to the battery tester, or both. The input device can be a scanner, a bar code reader, a mouse, a keyboard, a touchpad, a card reader, a signal receiver, a sensor, or a touchscreen. The battery tester can have a testing cable for testing the battery, the testing cable having a length and configuration that requires the input device to read battery identifying information from the battery when the testing cable is attached to the battery. For example, the battery tester can include a connector connecting the input device to the battery tester, and the testing cable and the connector can have respective lengths that require the input device to read battery identifying information only from the battery being tested and only when the testing cable is attached to the battery.

In another embodiment, the input device can be integrated into the battery tester, be part of a battery, or be part of a vehicle or part of an electrical system.

In another embodiment, the battery tester can be a pulsed impedance battery tester. The input device can be a bar code reader or a signal receiver. The testing cable can include a sensor that interacts with the tester, for example, by enabling a warranty compliant test.

A method of preventing automotive battery warranty fraud can include acquiring battery identifying information from a battery with an input device, and testing a characteristic of the battery with the battery tester. Testing can occur prior to, during or after acquiring the battery identifying information. This method includes attaching the battery tester to the battery. The battery tester can include a positive cable, a negative cable, and, optionally, an amps probe. Attaching the battery tester to the battery can include attaching the positive cable to a positive electrode of the battery and the negative cable to the negative electrode of the battery and can optionally include attaching an amps probe to a negative battery electrode.

The method can further include associating the battery identifying information with the battery, verifying the battery identifying information with the battery, or activating the battery tester after the battery identifying information is received. The battery identifying information can be verified, for example, by comparing the battery identifying information to a database that contains correct identifying information, which can be introduced in to the database when vehicle identification number (VIN) information is entered. To prevent fraud, an error signal can be supplied when the battery tester is disconnected from the battery after acquiring the battery identifying information and before testing the battery. The battery identifying information can be from a chip imbedded in the battery while testing.

After the testing is complete, a report indicating the characteristic of the battery and verifying the identity of the battery can be provided, where the report includes indicating completion of a nonfraudulent test. The report can be printed, or can be transmitted electronically. A nonfraudulent test result can be indicated in the report of the test results and can be used in combination with the warranty information for expense or material recovery under a warranty. A nonfraudulent test result can occur when the battery identifying information matches the battery being tested. Further, the result can indicated that the conduct of the test did not involve any attempts to bypass the fraud prevention mechanisms designed into the battery testing system. For example, the fraud prevention mechanisms can identify when the battery identifying information is input and then the battery cables are switched to a different battery. The test can return a report with an indication that the test is unacceptable for warranty purposes.

In another aspect, a system for preventing battery warranty fraud includes a battery tester, an input device configured to transmit battery identifying information to the battery tester, and battery identifying information associated with the battery. The input device can be attached to the battery tester in a manner preventing input of battery identifying information from the battery other than the battery being tested. The battery tester can include a communication device attached to it that allows the battery tester to access a database, which can be stored separately from the battery tester. The database can verify the identifying information received through the input device. The battery tester can include a verification unit that refuses to test the battery unless the input device provides battery identifying information corresponding to the battery.

In another aspect, a method of minimizing automobile part warranty fraud can include acquiring part identifying information capable of verifying the identity of a part, and testing a characteristic of the automobile part.

The details of one or more embodiments are set forth in the accompanying drawings and the description below. Other features, objects, and advantages are apparent from the description and drawings, and from the claims.

DETAILED DESCRIPTION

Figure 2:
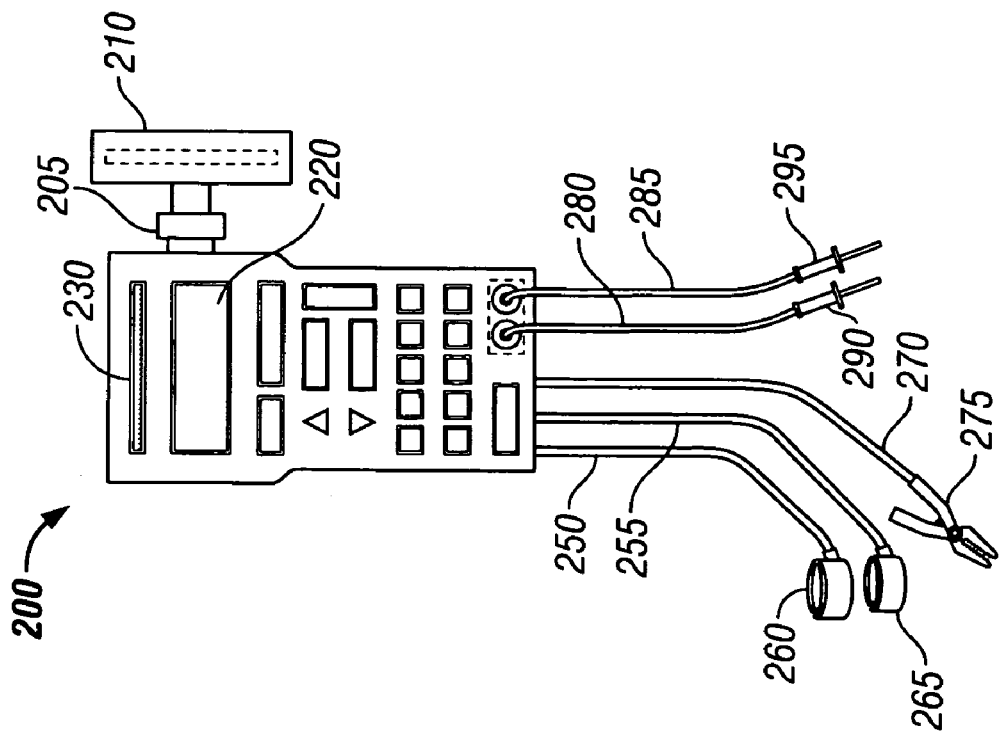
FIG. 2 is a schematic drawing depicting a battery tester.

Generally, a battery tester can be configured to reduce battery warranty fraud by requiring capture of battery identifying information prior to, during, or after, performing of a battery test. This information can be gathered through a variety of input devices. Additionally, the battery tester can be configured to verify the information. Verification can include confirming that the battery tested was the battery for which information was received.

The battery identifying information can be a code that uniquely identifies the battery and can be read by a variety of various input devices. For example, the battery identifying information is a code that can be processed or interpreted by using a look-up table or other algorithm to particularly identify the battery, and properties of the battery. The information is captured by a computing unit, such as a hand-held battery tester or a portable computer or any other device with computing or logic processing capabilities. Alternatively, the battery identifying information can be built into a battery, vehicle or electrical system. The code can include numeric characters, alphabetic characters, a bar code, an electromagnetic signal, or other digital, written, pictorial or representational form that is capable of being associated with an article of commerce. For example, the information can be coded like a bar code, an alphanumeric code, or other code, it can be in the form of a computer chip that sends a signal, or it can be a unique identifier where the information is downloaded from a database matching the identifier to the information. The capture can occur through either a direct cable connection, network connection, wireless communication. The battery identifying information can be contained, for example, in a unique code affixed to each battery contained in a label. The label can be associated with the battery by the battery manufacturer or reseller. Alternative ways of carrying the battery identifying information include a code encoded in a computer chip, a pictographic or symbolic code contained in molded features of the battery case, a code contained in a metal plaque attached to the battery case, a coded signal from an embedded transmitter, a light emission code, or a color or pattern code.

The information contained in the code or gathered from the signal or from a database can include information such as the cold crank amperage (CCA) or amperage-hours (AH) of the battery, the date of manufacture of the battery, the lot number or unit number of production or any other useful information than can be part of the unique information gathered specific to the battery. This information can be coupled with information entered in to the tester by the operator, such as make and model of car and VIN number. Alternatively, the VIN number can be scanned. The make and model of car can be searched in a database to verify that the battery being tested is the correct type of battery for the vehicle. By accessing another database that includes the VIN number and the appropriate CCA information it would be possible to ensure the correct battery was being used for the make and model associated with the VIN number.

The battery tester can receive the identifying information from the input device. The input device transfers the battery identifying information to the battery tester, for example, by a connection through a data transfer port of the tester. The input device itself can be made integral to the tester rather than as a separate detachable unit. For example, a bar code reader can be made part of the tester unit rather than as a detachable part or as a separate scanning wand with a cable. A suitable input device includes a bar code reader, a scanner, a mouse, a touchscreen, a touchpad, a camera, a card reader, a light emission detector, a chip reader, a signal receiver, an electromagnetic signal detector, a keypad or keyboard, or a combination thereof. The code, or a portion of the code, can be manually entered into the device, for example, using a keypad. Acquiring the information can include receiving a signal from the battery including a chip signal, or reading the information from the battery in any of a number of possible coding mechanisms previously detailed. The information can be verified on the spot in an updated database in the tester, or by receiving a contemporaneous wireless communication, such as from a wireless network or from an IR LED port.

By scanning or receiving the battery identifying information which contains a unique code for the battery, the code can be included on a report that includes the test result, such as on a print out, which can be the same as the code on the battery. The result can be downloaded to a databank in the tester or transmitted to a warranty center, either individually or in a batch of results. A warranty check can confirm that the code on the report matches the code on the battery. This procedure can reduce or eliminate the ability of a tester to provide a test result for a battery other than the one actually tested. The print out displaying the information can include a calibrated tamper-proof date and time stamp, either contained in the tester or accessed prior to testing. Other possible information of interest for the report can include ambient temperature, and specific measuring standards used such as SAE standards, DIN standards or Japanese standards, IEC standards, or EN standards. The report can also include the type of battery tested. The battery can be a lead acid, a gel or an absorbed glass mat (AGM) battery. By removing the data entry task from the operator or by having the verification procedure described herein, fraud can be prevented and operator input error can be reduced or eliminated.

The tester can be connected to a data source for verifying individual battery information, uploading or downloading information or upgrades, and printing out information using any of a variety of connection types including using wireless communications types such as infrared and wireless network communications. Basically, the tester can obtain data regarding an individual battery from other storage media or from online sources to compare to the battery identifying information received specifically from the battery. This verification step can assist in preventing fraud by switching labels or by using the same battery repeatedly.

One way the method can be defrauded or defeated is by altering the code on the battery before testing it, for example, by tampering with the code by removing one label and replacing it with another. It can be important to permanently affix the code to the battery to prevent tampering, for example, by using a very strong adhesive or by embedding the code in the battery. Furthermore, the method can be more productive if the surface to be read (unless the information is recognized in a manner other than reading) is a surface that can easily be cleaned. This type of surface can facilitate legibility for a clean input. So, for example, a label with a plastic-like finish, with possible overlay of a finishing coat for protection from natural elements and potentially damaging elements underhood, such as oils, dirt or corrosive chemicals, can form a preferred label.

A method of reducing battery warranty fraud can include acquiring battery specific information in a battery tester prior to, during or after testing the battery. The battery specific information can be input through a variety of mechanisms including scanning and reading a bar code. Once the information is obtained or verified the tester can initiate and perform the battery test. Fraud can be minimized by requiring information to be gathered prior to testing the battery, but after the battery tester has been connected to the battery. The cables with clamps connecting the battery tester to the battery can have sensors that indicate when they are attached to the same battery. Alternatively, the input device that receives the battery specific information from the battery could complete a conductivity circuit between the two tester cables and the input device.

For example, when the code from the battery is input into the tester, it can occur in such a way that the tester is not disconnected from the battery between the time of the test and the time of this code entry. This requirement is to prevent a test reading on one battery and then the scanning of a different battery. This would be a way to fraudulently beat the system in place. So the tester would need to interrupt any disconnecting of the tester during a testing routine (which included code inputting) and ask the user to start anew or print out a message with the test result indicating that the test had been interrupted by disconnecting. This message would then be grounds for rejection of warranty claims.

But there is still one loophole even with this step. One could connect the tester to one battery but have a second battery right next to this battery. A user could still connect the tester to one battery but scan the code of the second battery alongside and one could achieve this without disconnecting the tester from the first battery. To overcome this possible way around the attempt to protect the test result from fraudulent corruption will require at least one of two options. If the input device is on a short cord or built in as part of the tester, it may not physically be able to stretch as far as a second battery. Given the necessity to have the cords from the tester to be a certain length to reach batteries without inconveniencing the user, this limits the ability to tether the tester to so short a distance so that the input device could not reach a second battery. The battery tester can be configured to return an error code or to fail to test when anything suggesting possible fraud occurs, such as the cables being switched to a different battery without a test being conducted, or input information that does not match the battery to be tested.

The second option is for a signal to be received by the tester from the battery or from a part of the tester connected to the battery. If the battery contains an imbedded chip that sent off a signal with the code and this signal were inputted into the tester, for example, contemporaneously with the test, this can limit the options for fraudulent input.

Another way to tie the test result to the actual battery tested is to build in a signal of some type into one or both of the clamps that connect the tester to the battery. These "signal-sensors could then be detected by the code-inputting device, such as bar code reader, during the code-inputting routine. So, for example, the code, such as a bar code label, could be placed between the positive and negative terminals. The positive and negative connections would be made from the tester to the terminals. At the time that the code-inputting device was inputting the code from, for example, the bar code label, it would also receive the signals from the positive and negative tester clamp sensors. The inputting routine could be such that the input could complete only if the signals from the two clamps were picked up by the code-input device simultaneously with the code reading. By limiting the range of the signal from the sensors or requiring signals to be picked up by the code inputting device from both left and right of the code, this would tie the code inputting device's input to the actual battery being tested.

Certain functions performed by the tester can be built into a battery at the time of the manufacture of the battery or be included as part of a vehicle, such as with built-in sensors. In certain embodiments, the tester can lack any, some or all of the functions being performed by the tester and peripheral devices, such as a printer or code input device. For example, a faulty battery can be linked to a vehicle sensor, which sends a trouble code to some on-board computer. This onboard computer might for example be able to downloading a test result to a code reading or scanning device for printout, digital storage or digital communication. With the advent of telematics, such results might be sent automatically from the vehicle to a satellite and then received by an automotive service center.

A similar methodology can be used to evaluate and verify alternator replacement. Many of the alternators come with a bar code label. By inputting the bar code into the tester, obtaining a result from testing the alternator, then printing it out with the information on the printout, including the code, alternator diagnosis, possibly VIN code, and possibly date and time, this information can then be reviewed when the part is sent to a warranty return depot. If the print out matches the details of the part and the claim, the probability of a false claim will be greatly reduced.

It is also possible that as with an alternator, the methodology would be equally applicable to the evaluation and verification of starter motors. Ultimately the process and product could work for any motor vehicle part subject to warranty fraud.

Figure 1:
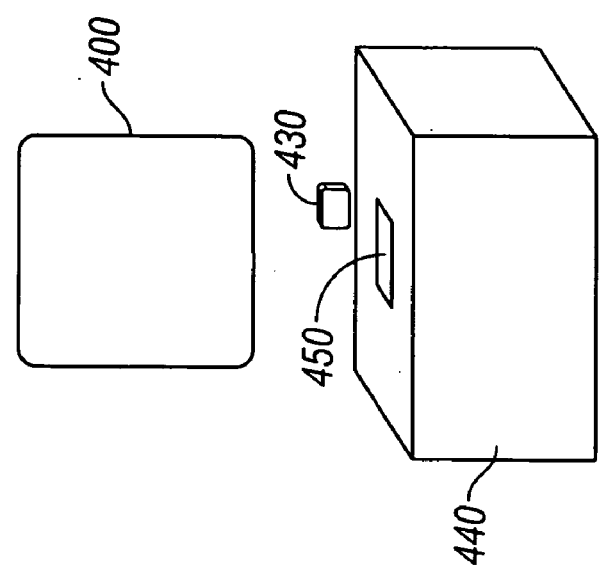
FIG. 1 is a part tester.

Referring to FIG. 1, a system for preventing warranty fraud includes tester 400 for testing automobile part 440. Input device 430 connected to tester 400 via data conduit 460 reads unique part identifying information 450 into tester 400 prior to performing the test.

Referring to FIG. 2, a battery tester 200 is configured to receive battery identifying information from an input device 210. The battery tester can be a portion of an electrical diagnostics tester. For example, tester 200 and device 210 can be directly electrically connected by data conduit 205. The input device 210 can be integral with the battery tester 200 (not shown). The battery tester 200 can include cables 250 and 255, which have clips 260 and 265, respectively, for attaching the tester to a battery. Battery tester 200 can include a cable 270 with a clip 275 that serves as an amps probe. In addition, the battery tester 200 can have multimeter cables 280 and 285 with test leads 290 and 295 connected to the battery tester at the multimeter slots. The leads 290 and 295 can be used for separate functions than the clips 260 and 265, as discussed below.

The battery tester 200 can have a display 220 that can be a video display, an LCD display or any other type of display that can transmit information to the user. The battery tester 200 can also include a printer 230, or other output device, for outputting the completed test information. The battery tester 200 can be configured to attach to a data supply system, such as a computer, for uploading and downloading and storing test information, verification information, warranty information, safety information, quality assurance information or other information needed or useful to test batteries in a manner to avoid fraud. The battery tester 200 can be configured with a wireless communication system for exchanging such information with a data system remotely. For example, the tester can include an infrared LED output to transmit information to printers or computers, or a wireless transmitter for sending information via wireless network connections. The tester can be configured with a flash memory module to simplify data transfer or to upgrade the tester.

The battery tester 200 can be a common battery tester, such as a pulsed impedance battery tester that can determine the internal resistance of the battery, a battery tester that uses voltage recovery methods to evaluate the battery, or a battery tester that uses conductance calculations to evaluating the battery. In order to test a battery via the internal resistance, for example, by the pulsed impedance method, it can be necessary to first expose the battery to a load pulse of high enough frequency to overcome the effect of any parasitic loads that may be draining the battery. The frequency can be so high that it is not affected by an alternator charging the battery. The internal resistance of the battery can be directly measured during digital signal processing of the voltage. Charge acceptance and battery condition can be performed to determine the condition of even completely discharged batteries.

The pulsed impedance technology solves some of the problems associated with the other two testers discussed below, including the challenge of testing batteries that are only partially charged. For example, voltage recovery testing has problems when the battery is completely discharged or when there are parasitic loads. In addition, voltage recovery systems can have difficulty accurately testing batteries that are surface charged and thus appear as fully charged even though the bulk of the battery is uncharged. The conductance testers can also have difficulty accurately testing batteries with parasitic loads, and partially discharged batteries. In addition, the conductance testers can have difficulty accurately testing a battery when the battery acid used does not have the specific gravity suggested by the manufacturer.

The voltage recovery test is performed by applying a first continuous load to the is battery and monitoring how far the battery voltage drops and then how the battery voltage recovers after the load is taken off. The tester then applies a second different continuous load and again looks at the voltage drop and voltage recovery after the load is taken off and compares the two results. The tester uses the voltage measurement results and a comparison of the results to determine the condition of the battery being tested. The tester uses the difference between the voltages obtained using the first and second load to determine how to compensate for the results obtained and to account for the test state of charge of the battery.

The conductance test basically involves setting up a very sensitive electronic balance circuit inside the tester. One arm of the electronic balance has an adjustment circuit while the other arm of the electronic balance is the test battery that is introduced via the test clips. The adjustment circuit is altered until the two arms of the balance are in equilibrium. The tester then records the amount of adjustment that was required and uses that information to calculate the conductance of the battery. The conductance of the battery is then used to determine if the battery is good or bad.

An example of a pulsed impedance battery tester can have different modes for determining different information about a vehicle's electrical system. There is a Simulated Loaded Voltage (SLV) mode (the Standard Battery test in the ElectroPro V12), a Managed mode (or Battery+Test mode in the ElectroPro V12), and a Multimeter Measurement mode. Each mode serves different testing purposes.

The SLV mode measures a simulated loaded voltage of the battery. The loaded volts test is a traditional measure of condition of automotive battery. It assesses the battery's ability to crank a vehicle's engine by determining how the battery voltage holds up under a high amperage load. This involves a unique pulsed impedance testing method to simulate a ½ CCA current 15-second load test on the battery (BCI test or Battery Council International test) that takes 5 seconds to perform.

The Managed Mode allows measurement of battery condition and rating as a percentage of service life remaining in the battery (except when the initial open circuit voltage (no load voltage) is under 12.2 volts), alternator/regulator output, integrity of battery clamp to battery post connections, and the parasitic drain (current drain from the battery when the ignition key is off).

The Multimeter Measurement mode allows measurement of DC volts between two measurement points, measurement of amps drain coming out of a battery with the engine off using the amps probe, measurement of relative resistance between two points, measurement of diode volts, measurement of Engine RPM, measurement of AC volts, and fuel injector testing using both the multimeter leads and the amps probe. A specific example of a pulsed impedance battery tester is an AUTOTEST Automotive Electrical System Analyzer or the ElectroPro V12 marketed by Bright Solutions, Inc.

Figure 3:
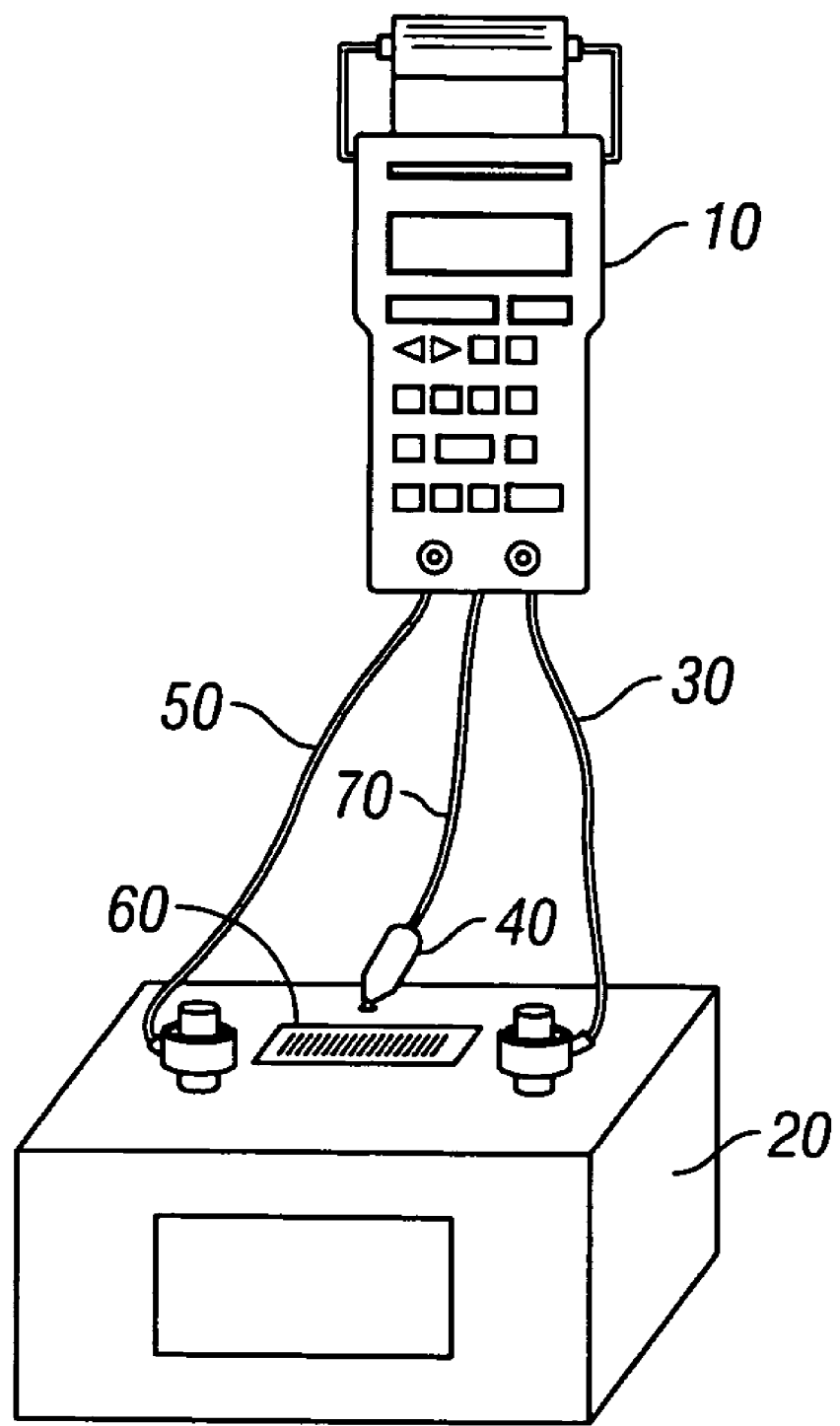
FIG. 3 is a schematic drawing depicting a battery tester-fraud prevention system.

Referring to FIG. 3, a battery tester 10 is connected to an automobile battery 20 using cables 30 and 50. Bar code reader 40 is connected to the battery tester via cable 70. Cables 30, 50, and 70 are deliberately short to ensure testing and encoding of the same battery, reducing the potential for fraud. The battery tester 10 can be configured such that cables 30 and 50 must be connected to the battery prior to testing. The battery tester 10 can be configured so that the tester or bar code reader 40 will not operate or permit a test result acceptable for warranty claims, without reader 40 being between cables 30 and 50 while reading code 60. A sensor can be used to monitor the position of the tester. After the connection is made, bar code reader 40 can read bar code 60 from the battery 20 obtaining information unique to that battery 20. Once this information is read into the tester 10, the test can be performed. If either (or both) of the cables 30 and 50 is removed from the battery 20 prior to testing, the tester 10 can be configured to refuse to run the test, or to return an error message with a print out. The barcode can be placed on the battery 20 by the manufacturer or reseller and can represent information that is specific to that battery. The battery 20 can be tested and a report can be printed, downloaded to a computer system, or transmitted electronically that includes the battery's identification information and status, including warranty status. By using a unique code for each battery, battery warranty fraud can be minimized.

The apparatus can be configured to assist in minimizing fraud. For example, the cables attaching the tester to the battery and attaching the bar code reader or other input device to the tester can be made too short to allow scanning of information from one battery, while testing another. In addition, the cables can be configured with sensors that interact with the input device, or the battery, or the coded information, requiring the information to come from the battery tested.

Figure 4:
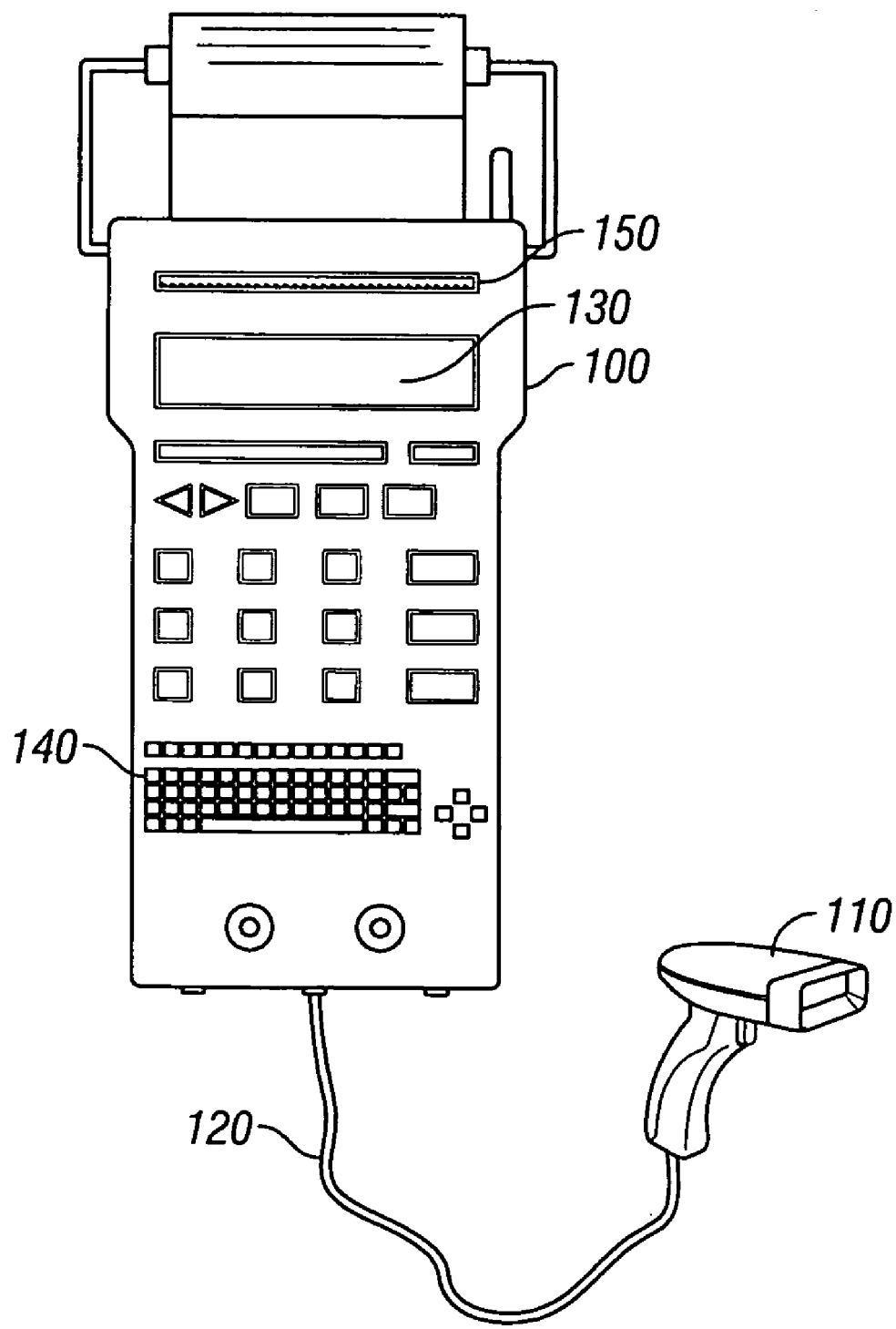
FIG. 4 is a schematic drawing depicting a battery tester connected to a scanner.

Referring to FIG. 4, a battery tester 100 is connected to an input device such as a scanner 110 either directly or via a connecting cable 120. The battery tester 100 includes a visual display 130 that provides status readouts, input prompts, and other testing information. The battery tester 100 can also have a keyboard 140 integral to the design for input of standard battery information that is not specific to the individual battery. The battery tester can have a printer 150 integral to the tester or can be connected to a printer via a connecting cable. The battery-tester can also store the testing information for later output.

A number of embodiments have been described. Nevertheless, it will be understood that various modifications may be made without departing from the spirit and scope of the invention. For example, other input devices, battery testers, and methods of encoding information can be used in the described method. Accordingly, other embodiments are within the scope of the following claims.

What is claimed is:

1. A method of testing an automobile battery comprising:
   acquiring battery identifying information from a battery that uniquely identifies the battery with a battery testing device;
   testing a characteristic of the battery with the battery testing device; and
   performing a warranty check to determine if the battery identifying information is verified for the battery being tested.

2. The method of claim 1 wherein testing includes exposing the battery to a very high frequency load pulse and measuring an internal resistance of the battery.

3. The method of claim 1 wherein testing includes:
   applying a first load to the battery for a first time period;
   measuring a first voltage at the end of the first time period;
   removing the load;
   measuring a first recovery voltage at the end of a first recovery time period;
   applying a second load to the battery for a second time period;
   measuring a second voltage at the end of the second time period;
   removing the load;
   measuring a second recovery voltage at the end of a second recovery time period; and
   comparing the first voltage and the second voltage to determine the characteristic.

4. The method of claim 1 wherein testing includes:
   adjusting an adjustment factor; and
   calculating the conductance of the battery using the adjustment factor.

5. The method of claim 1 wherein acquiring battery identifying information includes reading a bar code.

6. The method of claim 5 further comprising identifying the battery with the battery identifying information.

7. The method of claim 6 wherein the bar code is affixed to the battery.

8. The method of claim 1 wherein acquiring battery identifying information includes receiving a signal from the battery.

9. The method of claim 1 wherein acquiring battery identifying information includes inputting at least a portion of the battery identifying information from the battery with a manual input device.

10. The method of claim 1 wherein acquiring battery identifying information includes scanning the information from the battery.

11. The method of claim 1 wherein acquiring battery identifying information includes receiving light from an emission source associated with the battery.

12. The method of claim 1 wherein acquiring battery identifying information includes reading a portion of the information from a chip associated with the battery.

13. The method of claim 1 wherein the battery identifying information is coded.

14. The method of claim 13 wherein the code includes an alphanumeric code.

15. The method of claim 13 wherein the code includes a pictographic code.

16. The method of claim 13 wherein the code includes an electromagnetic signal.

17. The method of claim 13 wherein the code includes a bar code.

18. The method of claim 1 wherein the battery identifying information indicates a cold crank amperage of the battery.

19. The method of claim 1 further comprising providing a dealer part code of the battery in a report.

20. The method of claim 1 further comprising providing a warranty line number of the battery in a report.

21. The method of claim 1 wherein the battery identifying information includes Japanese standard information for the battery.

22. The method of claim 1 wherein the battery identifying information includes SAE standard information for the battery.

23. The method of claim 1 wherein the battery identifying information includes DIN specification information for the battery.

24. The method of claim 1 wherein the battery identifying information includes IEC standard information for the battery.

25. The method of claim 1 wherein the battery identifying information includes EN standard information for the battery.

26. An apparatus for testing a battery comprising:
   a battery tester configured to ascertain if an identifier that uniquely identifies a particular battery is verified for the battery being tested with a warranty check; and
   an input device associated with the battery tester, wherein the battery tester has a testing cable for testing the battery, the testing cable having a length and configuration that requires the input device to read battery identifying information from the battery when the testing cable is attached to the battery.

27. The apparatus of claim 26 wherein the input device is configured to receive battery identifying information.

28. The apparatus of claim 26 wherein the input device is configured to transmit battery identifying information to the battery tester.

29. The apparatus of claim 26 wherein the input device includes a scanner.

30. The apparatus of claim 26 wherein the input device includes a bar code reader.

31. The apparatus of claim 26 wherein the input device includes a mouse.

32. The apparatus of claim 26 wherein the input device includes a keyboard.

33. The apparatus of claim 26 wherein the input device includes a touchpad.

34. The apparatus of claim 26 wherein the input device includes a card reader.

35. The apparatus of claim 26 wherein the input device includes a touchscreen.

36. The apparatus of claim 26 wherein the input device includes a signal receiver.

37. The apparatus of claim 26 wherein the input device is integrated into the battery tester.

38. The apparatus of claim 26 wherein the battery tester is a pulsed impedance battery tester.

39. The apparatus of claim 38 wherein the input device is a bar code reader.

40. The apparatus of claim 38 wherein the input device is a signal receiver.

41. The apparatus of claim 26 wherein the battery tester includes a testing cable, the testing cable including a sensor that interacts with the tester.

42. A method of preventing automotive battery warranty fraud comprising:
   acquiring battery identifying information from a battery that uniquely identifies said battery with an input device;
   performing a warranty check to determine if the battery identifying information is verified for the battery being tested; and
   testing a characteristic of the battery with the battery tester.

43. The method of claim 42 wherein testing occurs after acquiring the battery identifying information.

44. The method of claim 42 wherein testing occurs prior to acquiring the battery identifying information.

45. The method of claim 42 wherein testing occurs while acquiring the battery identifying information.

46. The method of claim 42 further comprising attaching the battery tester to the battery.

47. The method of claim 42 wherein the battery tester includes a positive cable, a negative cable, and, optionally, an amps probe.

48. The method of claim 47 further comprising attaching the positive cable to a positive electrode of the battery and the negative cable to the negative electrode of the battery.

49. The method of claim 42 further comprising attaching an amps probe to a negative battery electrode.

50. The method of claim 42 further comprising associating the battery identifying information with the battery.

51. The method of claim 42 further comprising verifying the battery identifying information.

52. The method of claim 42 further comprising activating the battery tester after the battery identifying information is received.

53. The method of claim 42 further comprising providing an error signal when the battery tester is disconnected from the battery after acquiring the battery identifying information and before testing the battery.

54. The method of claim 42 wherein acquiring includes receiving a signal from a chip associated with the battery.

55. The method of claim 42 further comprising providing a report indicating the characteristic and verifying the identity of the battery.

56. The method of claim 55 wherein providing the report includes indicating completion of a nonfraudulent test.

57. A system for preventing battery warranty fraud comprising:
   a battery tester configured to perform a warranty check to determine if battery identifying information is verified for the battery being tested to confirm that the battery tested is the battery identified by the battery identifying information;
   an input device associated with the battery tester; and
   a battery identifying information associated with the battery.

58. The system of claim 57, wherein the battery tester has a testing cable for testing the battery, the testing cable having a length and configuration that requires the input device to read battery identifying information from the battery when the testing cable is attached to the battery.

59. The system of claim 57 wherein the input device is associated with the battery tester in a manner requiring input of battery identifying information from the battery.

60. The system of claim 59 wherein the database verifies the identifying information received through the input device.

61. The system of claim 59 wherein the battery tester includes a verification unit that refuses to report a battery test result unless the input device provides battery identifying information corresponding to the battery.

62. The system of claim 57 further comprising a communication device attached to the battery tester.

63. The system of claim 62 wherein the communication device allows the battery tester to access a database stored separately from the battery tester.

64. A method of minimizing automobile part warranty fraud comprising:

acquiring part identifying information capable of verifying the identity of a part;

verifying the authenticity of the part identifying information to confirm that the part tested is the part identified by the part identifying information with a warranty check; and testing a characteristic of the automobile part.

65. The method of claim 64 further comprising identifying the part and reporting the characteristic.

* * * * *